United States Patent [19]

Yamaguchi

[11] Patent Number: 4,862,460
[45] Date of Patent: Aug. 29, 1989

[54] TEST PATTERN GENERATOR

[75] Inventor: Kazuo Yamaguchi, Sagamihara, Japan

[73] Assignee: Hitachi, Ltd., Tokyo, Japan

[21] Appl. No.: 918,499

[22] Filed: Oct. 14, 1986

[30] Foreign Application Priority Data

Oct. 11, 1985 [JP] Japan .................. 60-224859

[51] Int. Cl.⁴ .......................................... G01R 31/28
[52] U.S. Cl. .................................................. 371/27
[58] Field of Search ............. 371/27, 25, 20, 21; 324/73 R; 364/900, 200

[56] References Cited

U.S. PATENT DOCUMENTS

| 4,389,723 | 6/1983 | Nigorikawa | 371/27 |
| 4,547,861 | 10/1985 | Lauiron | 371/27 |
| 4,555,663 | 11/1985 | Shimizu | 324/73 R |
| 4,639,919 | 1/1987 | Chang | 371/27 |
| 4,670,879 | 6/1987 | Okino | 371/27 |

OTHER PUBLICATIONS

"Model GR18, General Purpose Complex VLSI Test System, Standard Product Description and Specification", 10/84.

Primary Examiner—Michael R. Fleming
Attorney, Agent, or Firm—Antonelli, Terry & Wands

[57] ABSTRACT

A test pattern generator includes: an algorithmic pattern generator, a sequential pattern generator, a selector for selecting one of an algorithmic pattern and a sequential pattern for use with a specified pin of an object device to be tested; and a pattern controller for controlling the selector, whereby data to be supplied to a pin or pin block can be assigned in real time by the pattern controller.

14 Claims, 4 Drawing Sheets

FIG. 3
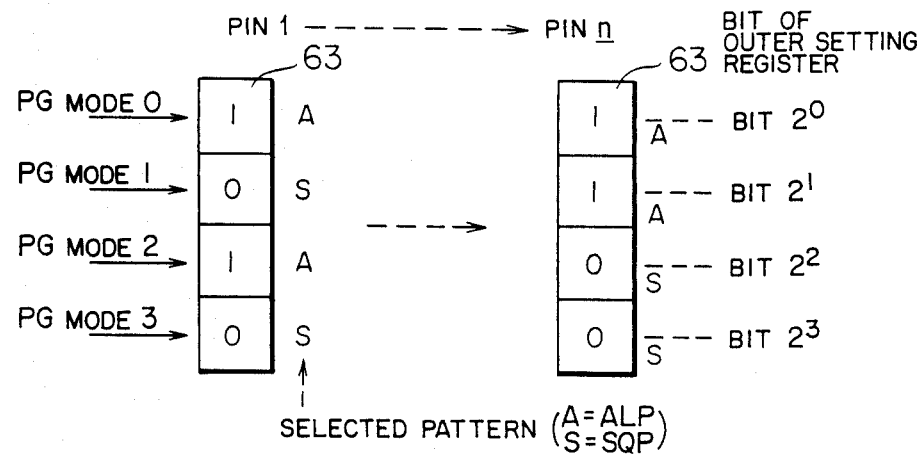
FIG. 4
| INPUT | | | ADDRESS/ DATA CONTROL SIGNAL A/D | ALPG ASSIGNMENT |
|---|---|---|---|---|
| ADDRESS/DATA CONTROL BIT | OUTER SETTING REGISTER 64 | | | |
| | $2^1$ | $2^0$ | | |
| X | 0 | 0 | 0 | ADDRESS SELECTION |
| X | 1 | 0 | 0 | |
| 0/1 | 0 | 1 | 0/1 | REAL TIME ADDRESS/DATA SELECTION |
| X | 1 | 1 | 1 | DATA SELECTION |
(X : ARBITRARY VALUE)
FIG. 6
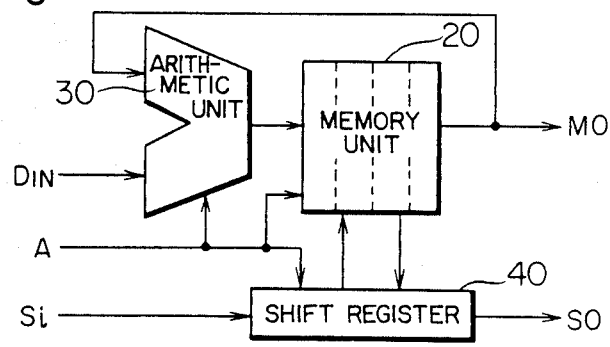

TEST PATTERN GENERATOR

BACKGROUND OF THE INVENTION

The present invention relates to a test pattern generator, and more particularly to a test pattern generator suitable for testing a complex device having a memory unit and a logical unit.

Various complex devices such as LSI devices having both memory units and logical units, multichips and the like have been developed with the help of high integration and high performance of recent LSI devices.

Generally, a test of specific functions of complex devices is carried out with a memory tester for a memory unit and with a logic tester for a logic unit. Otherwise, if a memory unit is tested with a logic tester, test patterns for a memory unit are stored beforehand in a pattern memory of the logic tester.

A test pattern generator of this type is known, for example, as disclosed in JP-A-55-52967. With this test pattern generator, patterns of two types are selectively generated by subjecting a support memory under the control of microprograms which also control a pattern generator used for producing regular address sequences for a memory unit test, the support memory being used for producing random address sequences for a logic unit test.

With this test pattern generator, however, it is difficult to obtain a perfect test result, such as in a consecutive operation/function test of a multiport section of a complex device as shown in FIG. 6 between its memory unit 20 and its logic unit, in a consecutive switching and reading test of multimemory cells, or in other tests. Further, each of a plurality of test patterns must be changed frequently for each pin or for each block of plural pins, so that it is impossible to efficiently perform pin assignment to each test pattern.

Another prior art technology changing test patterns for each pin of an LSI device in real time is disclosed in "Model GR18, General Purposes Complex VLSI Test System, Standard Product Description and Specification" by General Semiconductor Test Inc. According to this technology, the problem associated with pin assignment to each test pattern can be solved. However, in this publication, there is no disclosure of a particular construction of the test pattern selector for changing sequential pattern data for each pin in real time. Moreover, the pin control table used in controlling the test pattern selector is a memory array of 4k×4 bits. Since the pin control table is required to produce control signals for changing the test pattern data in real time, the amount of data stored in the memory becomes very large. Further, if the data is different for each pin, it is necessary to prepare a pin control table for each pin, thus resulting in a large system of pin control tables. Apart from the above, there is a tendency nowadays of increasing the number of test pins to reduce test time. Thus, the scale of pin control tables becomes very large.

SUMMARY OF THE INVENTION

It is an object of the present invention to eliminate the above problems and provide a compact test pattern generator capable of supplying a plurality of different pattern data is a desired pin or pin block at a desired test cycle.

To achieve the above object, the characteristic feature of the present invention resides in that the test pattern generator comprises means for generating an algorithmic pattern; means for generating a sequential pattern and wherein said sequential pattern is used with respect to a specified pin of an object device to be tested; and a pattern controller for controlling a selecting means, whereby data to be supplied to a pin or pin block can be assigned in real time by said pattern controller. A specific feature of the present invention resides in that the pattern controller is not constructed using a memory which stores data for the control of said selecting means, but micro control codes are skillfully employed to make the scale of the controller small.

BRIEF DESCRIPTION OF THE DRAWINGS

FIG. 3 is a schematic diagram illustrating the input/output response of the pattern controller;

FIG. 4 is a table showing an A/D output signal status of the pattern controller referenced to the address/data control signal and an input to the outer setting register;

FIG. 6 shows an example of the configuration of a complex device to which the test pattern generator of the present invention is applicable.

DESCRIPTION OF THE PREFERRED EMBODIMENTS

The preferred embodiment of the present invention will now be described with reference to the accompanying drawings.

Figure 1:
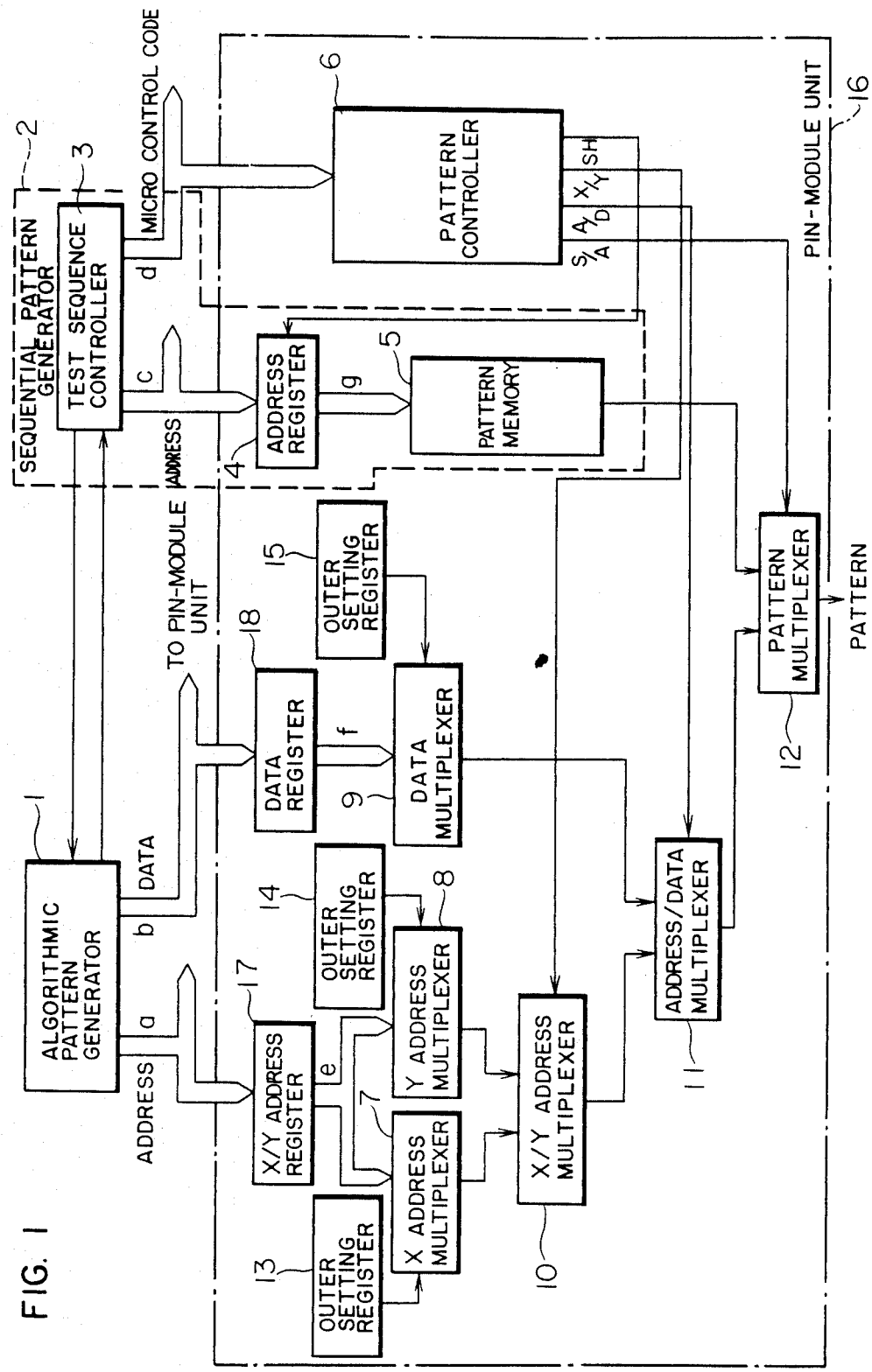
FIG. 1 is a block diagram showing the construction of a test pattern generator according to an embodiment of the present invention.

Referring to FIG. 1, reference numeral 1 denotes an algorithmic pattern generator (hereinafter abbreviated as ALPG) which generates an algorithmic pattern, while reference numeral 2 denotes a sequential pattern generator (hereinafter abbreviated as SQPG) which generates a sequential pattern. SQPG 2 is mainly constructed of a test sequence controller 3 for controlling each pin-module unit 16, an address register provided for each pin-module unit 16, and a pattern memory 5. The test sequence controller 3 gives an address to an address register 4 of the pin-module unit 16 via an address bus c. An output of the address register 4 is supplied to a pattern memory 5 storing a data pattern. The test sequence controller 3 further sends a micro control code to a pattern controller 6 via a bus line d. The pattern controller 6 controls to select a pattern. In this embodiment, the test sequence controller 3 provides micro control codes in order for the pattern controller to output four signals. The first one is a pattern mode generating signal S/A for switching between ALPG 1 and SQPG 2 in accordance with a pattern combination mode in the direction of pins. The second one is an address/data control signal A/D for selecting an address or data (including control data) of ALPG 1. The third one is an X/Y address control signal X/Y for selecting an X address or Y address of addresses of ALPG 1. The fourth one is a hold signal SH for controlling to output a hold pattern of SQPG 2, signal SH being inputted to an address register 4.

ALPG 1 gives an address to an X/Y address register 17 of each pin-module 16 via an address bus a and sends data to a data register 18 via a data bus b. The X/Y address register 17 inputs X address data and Y address data via bus line e, respectively to an X address multiplexer 7 and an Y address multiplexer 8. An externally set value from an outer setting register 13 is inputted to the X address multiplexer to select a desired bit of the X address, while an externally set value from an outer setting register 14 is inputted to the Y address multiplexer to select a desired bit of the Y address. An X address value selected by the X address multiplexer 7 and a Y address value selected by the Y address multiplexer 8 are inputted to an X/Y address multiplexer 10 to which X/Y address control signal X/Y is inputted from the pattern controller 6. The data register 18 sends data to a data multiplexer 9 via a bus line f. An externally set value from an outer setting register 15 is inputted to the data multiplexer 9 to select a desired data bit on the bus line f. Data selected by the data multiplexer 9 and an address signal selected by the X/Y address multiplexer 10 are sent to an address/data multiplexer 11 which selects either the data or the address in accordance with address/data control signal A/D from the pattern controller 6 and sends it to a pattern multiplexer 12. The pattern multiplexer 12, which receives a pattern signal from the pattern memory and an address or data signal from ALPG 1 via the address/data multiplexer 11, selects a pattern in accordance with pattern generating mode signal S/A from the pattern controller 6 and outputs it.

The construction of a single pin-module unit 16 is shown in the embodiment of FIG. 1, which unit is provided in one-to-one correspondence with each pin or pin block to readily assign each test pattern to a desired pin. However, the type of pattern applied to a pin or pin block is usually different depending on the type of device such as LSI device to be tested, the construction of a pin-module unit may be varied with each pin or pin block.

The operation of the test pattern generator of the embodiment will be described with reference to FIGS. 2 to 6. In this embodiment for performing multipurpose tests, a pin is supplied either with a data pattern, including address and data (including control data) patterns ALPG 1 and a data pattern read from the pattern memory 5 under control of the sequence controller 3, or with a hold pattern one cycle before the data pattern.

A complex device as shown in FIG. 6 differs from a conventional device constructed of a memory unit or a logic unit alone in that it is instead constructed in such a manner that a memory unit 20 and a logic unit composed of an arithmetic unit 30 and a shift register 40 operate in mutual association with each other. Therefore, for example, data of data input signal Din is subjected to arithmetic operation with data in the memory unit and the result is written in the memory unit 20. As a result, a read-out memory signal $\overline{MO}$ is not necessarily the same as the data input signal Din, which leads to difficulties in generating an expected value pattern if a conventional memory pattern generator ALPG 1 is used. For this reason, a logic pattern is required for an expected value pattern which is used for comparison with a memory output signal $\overline{MO}$ or an output data of the shift register 40.

Further, an address input signal A applied to a memory address input is used in part as a signal for setting an arithmetic mode of the arithmetic unit 30, and also as a signal for designating an output bit length mode of the shift register 40. Consequently, it becomes necessary to switch the address input signal A between the memory unit pattern and the logic unit pattern, even in such a test mode as an operation test using a path through the memory unit and the arithmetic unit, a consecutive test of the memory and the shift register, or other tests. Further, in a parallel operation test (disturb test) of the memory unit and the shift register, it becomes necessary to generate a memory unit pattern and a logic unit pattern in parallel, which leads to a necessity of selecting in real time either an algorithmic pattern or a sequential pattern for each pin.

Figure 2:
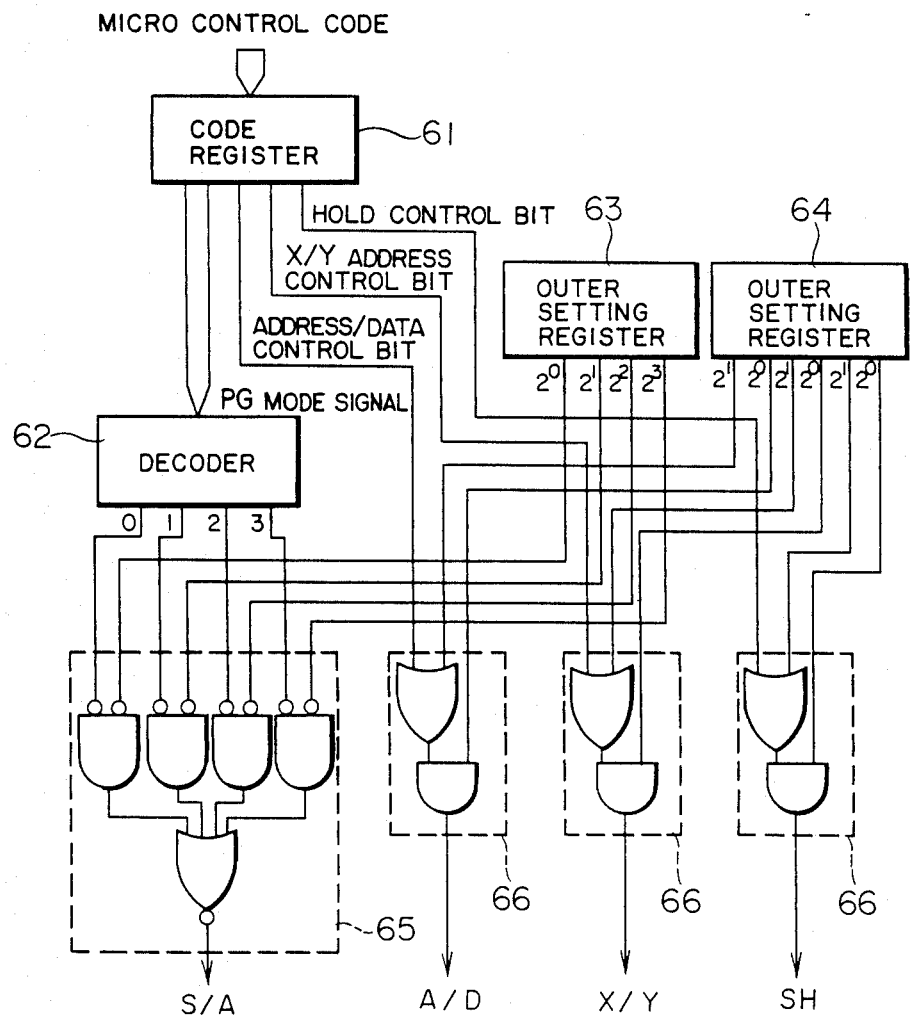
FIG. 2 is a block diagram showing a detailed construction of the pattern controller.

Pattern selection is controlled by the pattern controller 6 the detail of which will first be described with reference to FIG. 2. In the figure, a microcontrol code generated by the test sequence controller 3 is loaded in a code register 61. As previously described, in order to output four types of signals from the pattern controller 6, the micro control codes of the code register 61, together with the outputs from outer setting registers 63 and 64, are inputted to control gates 65 and 66. The outputs of the control gates 65 and 66 control the multiplexers 10, 11 and 12 and the address register 4 to select a pattern in real time. The outer setting registers 63 is used for designating pattern assignment of ALPG 1 or SQPG 2 for each corresponding pattern generating mode. The type of pattern selected by the control gate 65, which is inputted with pattern generating mode signals decoded by a decoder and values set by the outer setting register 63, is shown in FIG. 3. In particular, if the bit value of the outer setting register 63 is "1", output signal S/A of the control gate 65 becomes "1" to select an algorithmic pattern (hereinafter abbreviated as ALP) only in a pattern generating mode (hereinafter abbreviated as PG mode) corresponding to that bit. Whereas if the bit value of the outer setting register 63 is "0", output signal S/A becomes "0" to select a sequential pattern (hereinafter abbreviated as SQP) only in PG mode corresponding to that bit. Thus, for a repetitive pattern assignment of ALP→SQP→ALP→SQP of each test cycle for pin 1, bit data "0101"=(5) in hexadecimal notation is set in the outer setting register 63 and the PG mode signals mode 0→mode 1→mode 3→mode 0 are sequentially generated in this order, to thereby perform pattern assignment in real time. In this case, for a repetitive pattern assignment of ALP SQP for respective two test cycles, bit data "0011"=(3) in hexadecimal notation is set in the outer setting register 63.

Address/data control signal A/D of an ALP pattern is shown in FIG. 4 which signal varies with an address data control bit from the code register 61 and two bit data of the outer setting register 64, respectively inputted to the control gate 66. That is, three modes are obtained as address data control signal A/D. The first one is a mode selecting an address of ALPG 1 during the entire test cycle irrespective of the address/data control bit from the code register 61. The second one is a mode selecting in real time an address or data for each test cycle, depending upon the address/data control bit from the code register 61. The third one is a mode selecting data of ALPG 1 during the entire test cycle irrespective of the address/data control bit from the code register 61. More particularly, for the first mode the $2^0$ bit of the outer setting register 64 is set at "0" to make the address/data control signal A/D outputted by the control gate 66 "0". Thus, the output pattern from the address/data multiplexer 11 is changed to an address. For the second mode the $2^0$ bit and $2^1$ bit of the outer setting register 64 are set respectively at "1" and "0" so that the value of the address/data control bit per se from the code register 61 is directly outputted as address/data control signal A/D. The value obtained at that time is used to change the output pattern of the address/data multiplexer 11 to an address or data. For the third mode both the $2^0$ bit and $2^1$ bit of the outer setting register 64 are set at "1" to effect in an address/data control signal A/D of "1" at the output of control gate 66 and thereby change the output pattern of the address/data multiplexer 11 to data.

Selection control for an X or Y address of an ALP pattern is executed using an X/Y address control bit exactly in the same manner as selection control for an address or data of an ALP pattern shown in FIG. 4. Hold pattern control for an SQP pattern is also the same as with FIG. 4, wherein signal SH outputted from the control gate 66 inhibits loading an address to the address register 4 to thereby enable outputting from the pattern memory 5 a pattern used one cycle before. It is apparent that in the case of selecting an X/Y address of an ALP pattern, address/data selecting signal A/D is set to an address, and pattern selecting mode signal S/A is set to an ALP pattern. It is also apparent that in case of outputting a hold pattern of an SQP pattern, besides signal SH, pattern selecting mode signal S/A is set to an SQP pattern.

The pattern controller described in the above embodiment has an advantageous effect in that the size is reduced about one half of that of a conventional pin control table.

Figure 5:
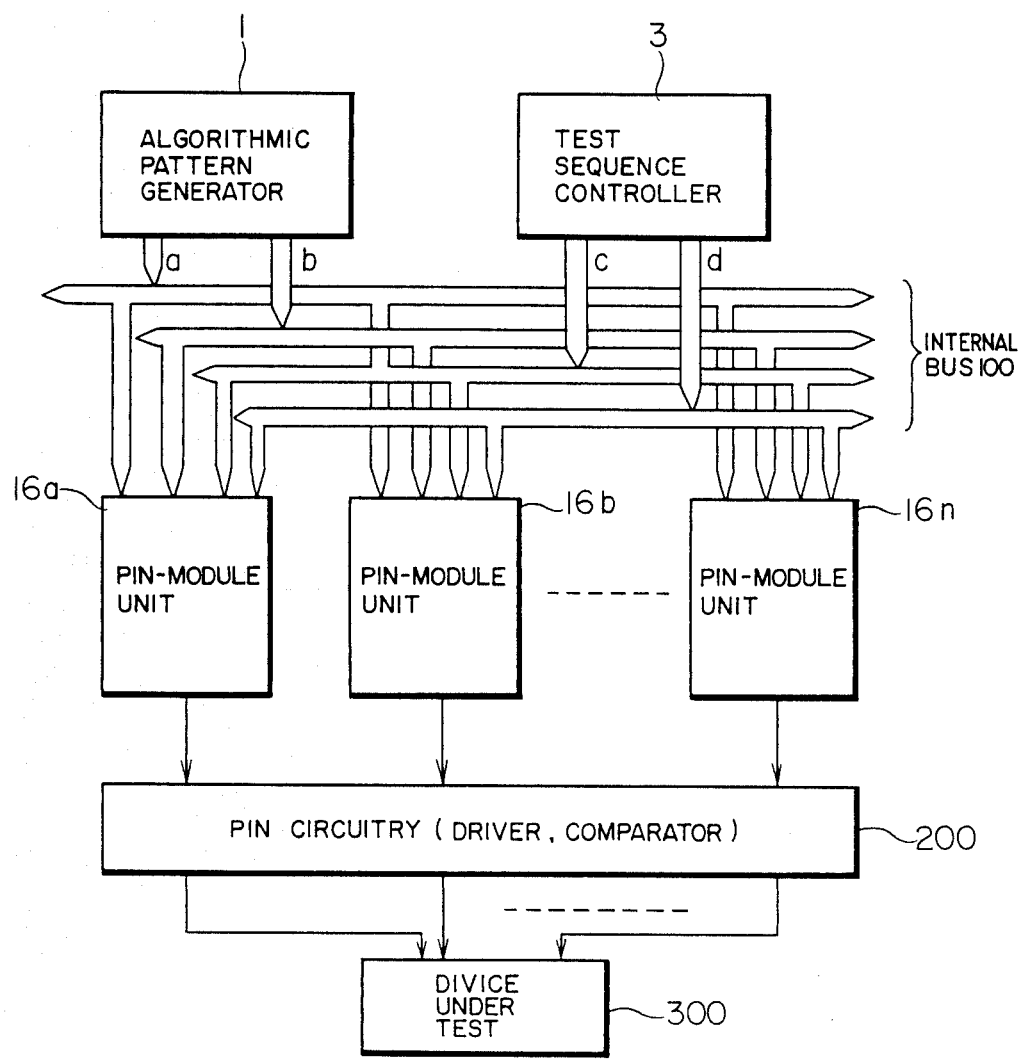
FIG. 5 is a block diagram showing the entire system wherein the test pattern generator of the invention is used as a test equipment.

FIG. 5 shows the entire arrangement of the test pattern generator of the present invention applied to a test equipment. In the figure, the algorithmic pattern generator 1 is used for generating a test pattern for a memory unit of a device 300 to be tested. The generator 1 delivers onto an internal bus 100 a memory address a and b including data to be written in a memory and a memory control signal. The test sequence controller 3 delivers onto the internal bus 100 a memory address c for use in outputting pattern data for a logic unit and a micro control code d of pin assignment information. Various pattern data and control data on the internal bus 100 are supplied to pin-module units 16a to 16n whose number exceeds at least the number of pins of the test device 300. In each of the pin-module units 16a to 16n, various pattern assignments are attained in real time independently for each pin. In the pin-module, a waveform shaper (although not shown in FIG. 1) for shaping a waveform after pin assignment is provided. Each of the output patterns is supplied to drivers and comparators of a pin circuitry 200 at a tester heading portion and thereafter is supplied to the test device 300 as a test pattern. The algorithmic pattern generator 1 is started under the control of the micro program of the test sequence controller 3 and stops its operation upon reception of a signal from the algorithmic pattern generator 1 itself.

In the above embodiment, the number of combination patterns in the direction of pin is mode four by using the PG mode signal. However, if the number (m bit) of PG mode signals is increased, it is possible to increase the number of combination patterns to $2^m$. The outer setting registers 13, 14 and 15 select beforehand an optional one bit for each pin-module unit 16a since the X/Y address and data of ALPG 1 have a specific bit length. Performing such selection in real time may be made by increasing the number of micro control codes of the test sequence controller 3 and by the use of the control gate 66.

Further, in the above embodiment, although a pair of ALPG 1 and the sequence controller 3 has been used for all of the pin-module units 16, plural pairs of ALPG 1 and the sequence controller may be used if bus selectors and bus distributors are provided to share the pattern supply to the pin-module units.

The present invention enables to provide a compact test pattern generator capable of supplying a desired test pattern among a plurality of different patterns to a desired pin or pin block.

I claim:

1. A test pattern generator comprising:
   means for generating an algorithmic pattern;
   means for generating a sequential pattern;
   means coupled to said algorithmic pattern generating means and to said sequential pattern generating means for selecting pattern data generated from either said algorithmic pattern generator means or said sequential pattern generator means for use with a specified pin or pin block of an object device to be tested; and
   a pattern controller for controlling said selecting means, whereby data to be supplied to a pin or pin block can be selectively assigned in real time by said pattern controller.

2. A test pattern generator according to claim 1, wherein said sequential pattern generating means includes a test sequence controller for generating a micro control code for controlling a test sequence, and wherein said pattern controller is controlled in accordance with said micro control code.

3. A test pattern generator according to claim 2, wherein said sequential pattern generating means further comprises an address register, coupled to said test sequence controller, for outputting an address designating signal therein from said test sequence controller, and a pattern memory, coupled to said address register, for storing therein an output of said address register.

4. A test pattern generator according to claim 1, wherein said pattern controller outputs: a pattern generating mode signal S/A for effecting in the selection of either said algorithmic pattern or said sequential pattern; an address/data control signal A/D for effecting in the selection of either an address or data generated by said algorithmic pattern generator means; an X/Y address control signal for effecting in the selection of either an X address or Y address of said algorithmic pattern; and a hold signal SH for controlling the outputting of a hold pattern of said sequential pattern.

5. A test pattern generator according to claim 1, wherein said selecting means comprises: an X/Y address multiplexer for selecting an address signal from said algorithmic pattern generating means; a data multiplexer for selecting a data signal generated by said algorithmic pattern generating means; an address/data multiplexer coupled to said X/Y address multiplexer and to said data multiplexer for selecting and outputting either said address signal selected by said X/Y address multiplexer or said data signal selected by said data multiplexer; and a pattern multiplexer, coupled to said address/data multiplexer and to an output of said sequential pattern generating means, for selecting the output from said address/data multiplexer or from said sequential pattern generating means.

6. A test pattern generator according to claim 1, wherein said pattern controller comprises: a code register to which a micro control code is inputted; a decoder to which a pattern generating mode signal outputted from said code register is inputted; a control gate to which an address/data control bit, an X/Y address control bit and a hold control bit respectively outputted from said code register, and the output signal from said decoder, are inputted; and an outer setting register for supplying a set value to said control gate.

7. A test pattern generator according to claim 1, wherein said pattern controller comprises:
- a code register for outputting in response to micro control codes a pattern generating mode signal, an address/data control bit, an X/Y address control bit and a hold control bit;
- a decoder, coupled to said code register, for generating an output signal in response to said pattern generating mode signal;
- an outer setting register for outputting a set value signal; and
- a control gate for inputting said set value signal therein and being coupled to said decoder and to said code register for outputting signals to control said selecting means in response to said output signal from said decoder and said address/data control bit, said X/Y address control bit and said hold control bit, respectively, from said code register.

8. A test pattern generator according to claim 7, wherein said control gate comprises:
- means for respectively outputting a pattern generating mode signal S/A, an address/data control signal A/D, and X/Y address control signal and a hold signal SH for controlling said selecting means.

9. A test pattern generator comprising:
- means for generating an algorithmic pattern;
- a test sequence controller for generating an address signal and a micro control code which are used for outputting pattern data for a logic unit test; and
- a plurality of pin-module units provided in correspondence to a plurality of pins for receiving the outputs from said algorithmic pattern generating means and said test sequence controller, each said pin-module unit comprising means, coupled to said algorithmic pattern generating means and to said test sequence controller, for selecting either a pattern data generated by said algorithmic pattern generating means or a sequential pattern generated in accordance with the output from said test sequence controller, and a pattern controller, coupled to said test sequence controller, for controlling said selecting means in accordance with said micro control code received from said test sequence controller.

10. A test pattern generator according to claim 9, wherein said pattern controller outputs: a pattern generating mode signal S/A for effecting in the selection of either said algorithmic pattern or said sequential pattern; an address/data control signal A/D for effecting in the selection of either an address or data generated by said algorithmic pattern generator means; and X/Y address control signal for effecting in the selection of either an X address or Y address of said algorithmic pattern; and a hold signal SH for controlling the outputting of a hold pattern of said sequential pattern.

11. A test pattern generator according to claim 9, wherein said selecting means comprises: an X/Y address multiplexer for selecting an address signal from said algorithmic pattern generating means; a data multiplexer for selecting a data signal generated by said algorithmic pattern generating means; an address/data multiplexer coupled to said X/Y address multiplexer and to said data multiplexer for selecting and outputting either said address signal selected by said X/Y address multiplexer or said data signal selected by said data multiplexer; and a pattern multiplexer coupled for selecting either the output from said address/data multiplexer or said sequential pattern.

12. A test pattern generator according to claim 9, wherein said pattern controller comprises: a code register to which a micro control code is inputted; a decoder to which a pattern generating mode signal outputted from said code register is inputted; a control gate to which an address/data control bit, an X/Y address control bit and a hold control bit respectively outputted from said code register, and the output signal from said decoder are inputted; and an outer setting register for supplying a set value to said control gate.

13. A test pattern generator according to claim 9, wherein said pattern controller comprises:
- a code register for outputting in response to said micro control code a pattern generating mode signal, an address/data control bit, an X/Y address control bit and a hold control bit;
- a decoder, coupled to said code register, for generating an output signal in response to said pattern generating mode signal;
- an outer setting register for outputting a set value signal; and
- a control gate for inputting said set value signal therein and being coupled to said decoder and to said code register for outputting signals to control said selecting means in response to said output signal from said decoder and said address/data control bit, said X/Y address control bit and said hold control bit, respectively, from said code register.

14. A test pattern generator according to claim 13, wherein said control gate comprises:
- means for respectively outputting a pattern generating mode signal S/A, an address/data control signal A/D, an X/Y address control signal and a hold signal SH for controlling said selecting means.

* * * * *